(12) United States Patent
Matsumoto et al.

(10) Patent No.: US 8,222,645 B2
(45) Date of Patent: Jul. 17, 2012

(54) DISPLAY DEVICE

(75) Inventors: Katsumi Matsumoto, Mobara (JP);
Hideki Nakagawa, Chiba (JP);
Yoshiharu Owaku, Mobara (JP);
Terunori Saitou, Mobara (JP); Toshio Miyazawa, Chiba (JP); Takahiro Kamo, Shibuya (JP); Takuo Kaitoh, Mobara (JP)

(73) Assignees: Hitachi Displays, Ltd., Chiba (JP);
Panasonic Liquid Crystal Display Co., Ltd., Hyogo-ken (JP)

( * ) Notice: Subject to any disclaimer, the term of this patent is extended or adjusted under 35 U.S.C. 154(b) by 249 days.

(21) Appl. No.: 12/702,975

(22) Filed: Feb. 9, 2010

(65) Prior Publication Data
US 2010/0230675 A1   Sep. 16, 2010

(30) Foreign Application Priority Data

Mar. 12, 2009   (JP) ................................. 2009-058903

(51) Int. Cl.
*H01L 29/04* (2006.01)
*H01L 31/036* (2006.01)
*H01L 31/0376* (2006.01)
*H01L 31/20* (2006.01)

(52) U.S. Cl. .............................. 257/59; 257/72; 257/292
(58) Field of Classification Search ...................... 257/72
See application file for complete search history.

(56) References Cited

U.S. PATENT DOCUMENTS
2006/0164401 A1*  7/2006  Ishida ........................... 345/173
2009/0002341 A1    1/2009  Saito et al.

FOREIGN PATENT DOCUMENTS
JP   2008-305154   12/2008
* cited by examiner

*Primary Examiner* — Thien F Tran
(74) *Attorney, Agent, or Firm* — Antonelli, Terry, Stout & Kraus, LLP.

(57) ABSTRACT

A display device having a photosensor which exhibits excellent photoelectric conversion efficiency is provided. In a display device which forms photosensors on a substrate thereof, the photosensor is formed by sequentially stacking a gate electrode, a gate insulation film and a semiconductor layer in such an order or in an opposite order from a substrate side, and electrodes are connected to both sides of the semiconductor layer respectively, the semiconductor layer is formed of a stacked body consisting of a crystalline semiconductor layer and an amorphous semiconductor layer, and the crystalline semiconductor layer is arranged on the gate insulation film side.

9 Claims, 8 Drawing Sheets

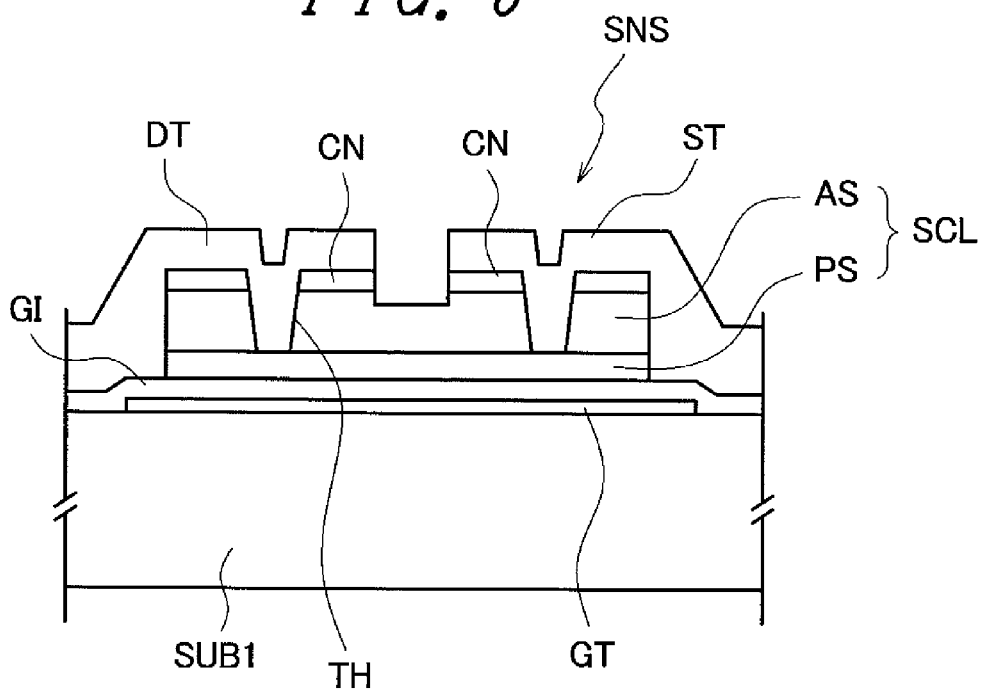
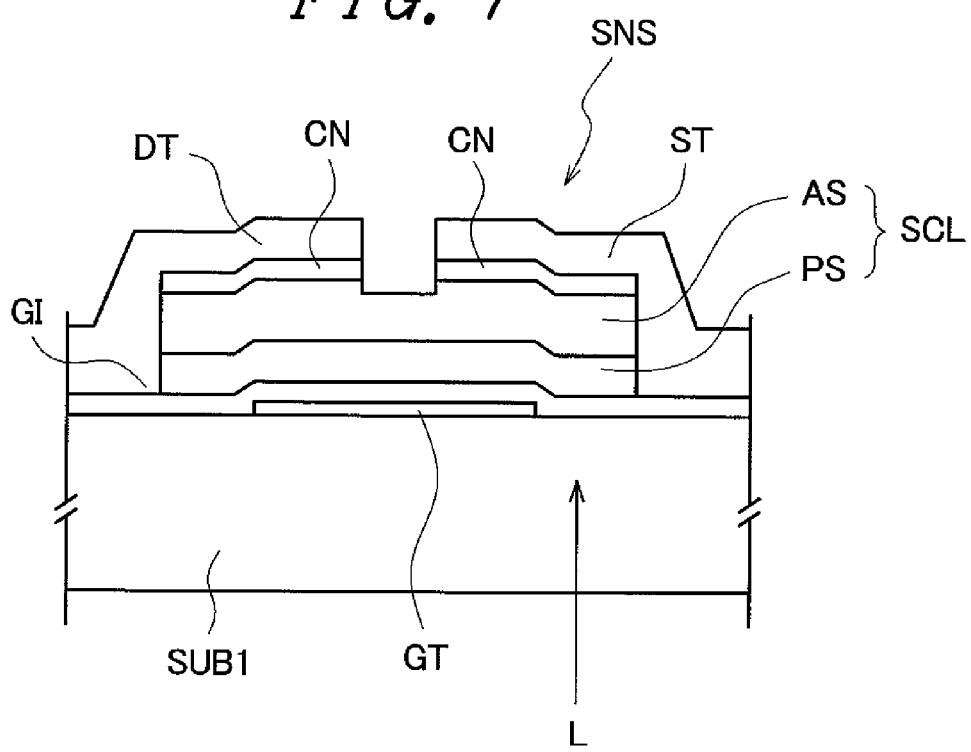

DISPLAY DEVICE

The present application claims priority from Japanese application JP 2009-058903 filed on Mar. 12, 2009, the content of which is hereby incorporated by reference into this application.

BACKGROUND OF THE INVENTION

1. Field of the Invention

The present invention relates to a display device, and more particularly to a display device which incorporates a photosensor therein.

2. Description of the Related Art

For example, there has been known a liquid crystal display device (panel) which arranges a plurality of photosensors in a liquid crystal display region in a dispersed manner together with pixels.

In such a liquid crystal display device, the photosensor detects a finger, a pen or the like which approaches a panel surface, coordinates of the finger, the pen or the like are calculated, and a result of the calculation is reflected on a display image. Such a liquid crystal display device can also be used as an authentication input part of a finger print or the like.

In this case, the photosensor is mounted on a surface of a substrate which constitutes an envelope of a liquid crystal display panel and hence, a semiconductor layer of the photosensor is usually formed using amorphous silicon, polysilicon or microcrystalline silicon or the like, for example. To take photoelectric conversion efficiency of the photosensor into consideration, it is desirable to use mono-crystalline silicon, GaAs or the like as a material for forming the semiconductor layer. However, when the semiconductor layer is formed on the surface of the substrate using such a material, the manufacture of the photosensor becomes complicated and expensive and hence, the material for forming the photosensor is limited to the above-mentioned material.

JP-A-2008-305154 (patent document 1) discloses such a liquid crystal display device.

SUMMARY OF THE INVENTION

However, when the photosensor is formed using amorphous silicon or polysilicon, there arises a drawback that photoelectric conversion efficiency cannot be sufficiently ensured.

In general, the photosensor is usually configured such that a reverse-directional voltage is applied to the diode structure having two terminals, and electron-hole pairs generated by incidence of light are separated from each other. Here, the photoelectric conversion efficiency of the photosensor is calculated by a product (N×E) of the number of electron-hole pairs N generated by incidence of light and efficiency E in separating the generated electron-hole pairs.

FIG. 9A shows a mechanism of photoelectric conversion when the photosensor is formed of an amorphous semiconductor layer made of amorphous silicon or the like, and FIG. 9B shows a mechanism of photoelectric conversion when the photosensor is formed of a crystalline semiconductor layer made of polysilicon or the like, for example.

Both FIG. 9A and FIG. 9B show the photosensor having the thin film transistor (TFT) structure in which a gate electrode (indicated by symbol GT in the drawing) is electrically connected with either one of a drain electrode and a source electrode. The amorphous semiconductor layer AS shown in FIG. 9A and the crystalline semiconductor layer PS shown in FIG. 9B are respectively depicted with thicknesses corresponding to thicknesses of layers formed on a substrate. Further, in FIG. 9A and FIG. 9B, symbol + indicates holes and symbol − indicates electrons.

When the amorphous semiconductor layer AS is used as the semiconductor layer, as shown in FIG. 9A, the electron-hole pair which is separated by the incidence of light L exhibits a characteristic that the electron and the hole are readily coupled and hence, the efficiency E is small whereby the photoelectric conversion efficiency becomes low. On the other hand, when the crystalline semiconductor layer PS is used as the semiconductor layer, due to the restriction imposed on a manufacturing process, the thickness of the semiconductor layer becomes approximately 50 nm so that light having a wavelength larger than 500 nm passes through the semiconductor layer. Accordingly, as shown in FIG. 9B, the number of electron-hole pairs N generated by the incidence of light becomes small thus lowering the photoelectric conversion efficiency.

Accordingly, it is an object of the present invention to provide a display device which includes a photosensor having excellent photoelectric conversion efficiency.

According to the display device of the present invention, a semiconductor layer which constitutes a photosensor incorporated in the display device has the stacked structure consisting of an amorphous semiconductor layer (for example, made of amorphous silicon) and a crystalline semiconductor layer (for example, made of polycrystalline silicon or microcrystalline silicon). By compensating for a defect of one semiconductor layer with the other semiconductor layer in a complementing manner, photoelectric conversion efficiency can be largely enhanced.

The present invention may have the following constitution, for example.

(1) According to one aspect of the present invention, there is provided a display device which forms photosensors on a substrate thereof, wherein the photosensor is formed by sequentially stacking a gate electrode, a gate insulation film and a semiconductor layer in such an order or in an opposite order from a substrate side, and electrodes are connected to both sides of the semiconductor layer respectively, the semiconductor layer is formed of a stacked body consisting of a crystalline semiconductor layer and an amorphous semiconductor layer, and the crystalline semiconductor layer is arranged on a gate insulation film side.

(2) In the display device having the constitution (1), the crystalline semiconductor layer is made of polysilicon or microcrystalline silicon, and the amorphous semiconductor layer is made of amorphous silicon.

(3) In the display device having the constitution (1), the photosensor is formed by sequentially stacking the gate electrode, the gate insulation film, and the semiconductor layer in such an order from the substrate side, an impurity semiconductor layer doped with impurities is formed on a surface of the amorphous semiconductor layer, and the respective electrodes are connected to the semiconductor layer via the impurity semiconductor layer.

(4) In the display device having the constitution (1), the photosensor is formed by sequentially stacking the gate electrode, the gate insulation film and the semiconductor layer in such an order from the substrate side, and the respective electrodes are connected to the crystalline semiconductor layer via contact holes which are formed in the amorphous semiconductor layer.

(5) In the display device having the constitution (1), the display device includes a display region in which pixels are arranged in a matrix array, and the photosensor is formed in a portion of a region of the pixel.

(6) In the display device having the constitution (5), a plurality of photosensors are formed, and the plurality of photosensors are arranged within the display region in a dispersed manner.

(7) In the display device having the constitution (1), the display device is a liquid crystal display device.

(8) In the display device having the constitution (7), the display device is formed of a liquid crystal display panel and a backlight which is arranged on one surface side of the liquid crystal display panel, and the photosensors detect a quantity of light emitted from the backlight.

(9) In the display device having the constitution (1), the display device is an organic EL display device.

(10) According to another aspect of the present invention, there is provided a display device which forms photosensors on a substrate thereof, wherein the photosensor includes a stacked body consisting of a crystalline semiconductor layer and an amorphous semiconductor layer, the crystalline semiconductor layer includes an i layer, an n-type layer and a p-type layer, the i layer abuts on the n-type layer at a first end portion thereof as viewed in a plan view, and abuts on the p-type layer at a second end portion thereof which is arranged on a side opposite to the first end portion, and an electrode is formed on an upper surface of a region of the amorphous semiconductor layer which overlaps with the n-type layer and an electrode is formed on an upper surface of a region of the amorphous semiconductor layer which overlaps with the p-type layer.

(11) In the display device having the constitution (10), the display device includes a display region in which pixels are arranged in a matrix array, and the photosensor is formed in a portion of a region of the pixel.

(12) In the display device having the constitution (11), a plurality of photosensors are formed, and the plurality of photosensors are arranged within the display region in a dispersed manner.

(13) In the display device having the constitution (10), the display device is a liquid crystal display device.

(14) In the display device having the constitution (13), the display device is formed of a liquid crystal display panel and a backlight which is arranged on one surface side of the liquid crystal display panel, and the photosensors detect a quantity of light from the backlight.

(15) In the display device having the constitution (10), the display device is an organic EL display device.

The above-mentioned constitutions merely constitute one example of the present invention, and the present invention can be suitably modified without departing from a technical concept of the present invention. Further, other constitutional examples of the present invention other than the above-mentioned constitutions will become apparent from the description of the whole specification and drawings.

The display device according to the present invention can include the photosensor which exhibits the excellent photoelectric conversion efficiency.

Other advantageous effects of the present invention will become apparent from the description of the whole specification.

BRIEF DESCRIPTION OF THE DRAWING

FIG. 6 is a constitutional view showing a photosensor which is incorporated in a display device according to an embodiment 2 of the present invention;

FIG. 7 is a constitutional view showing a photosensor which is incorporated in a display device according to an embodiment 3 of the present invention;

DESCRIPTION OF THE PREFERRED EMBODIMENT

Embodiments of the present invention are explained in conjunction with drawings. Here, in the respective drawings and the respective embodiments, parts having identical or similar constitutions are given same symbols, and their repeated explanation is omitted.

Embodiment 1

Figure 2A:
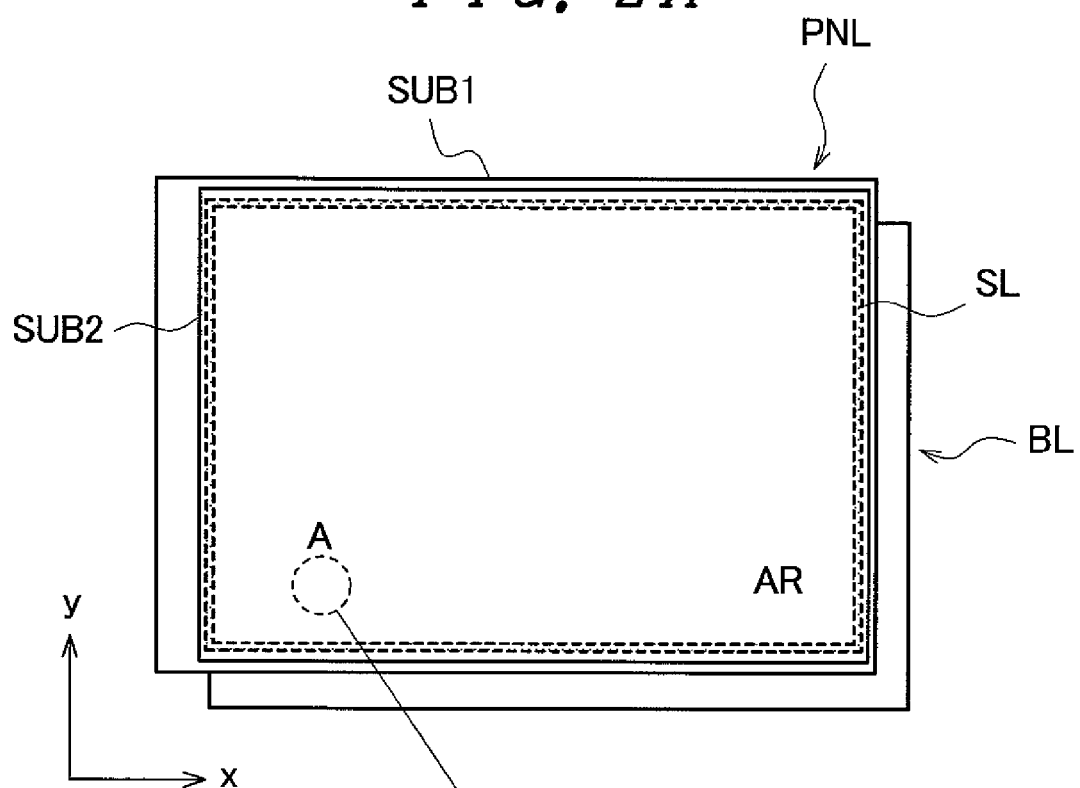
FIG. 2A and FIG. 2B are plan views of the display device of the present invention by taking a liquid crystal display device as an example.

FIG. 2A is a plan view showing a display device of the present invention. For example, the display device shown in FIG. 2A is a liquid crystal display device.

In FIG. 2A, the liquid crystal display device is formed of a liquid crystal display panel PNL, and a backlight BL which is arranged on a back surface of the liquid crystal display panel PNL.

Figure 2B:
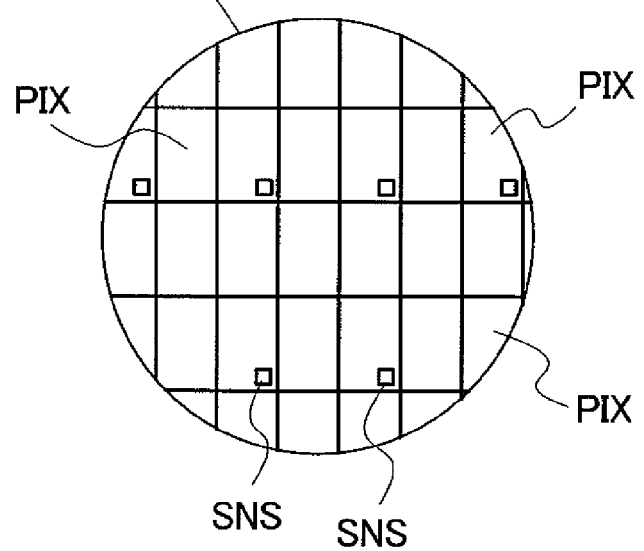

The liquid crystal display panel PNL includes an envelope which is formed of a substrate SUB1 and a substrate SUB2 which are arranged to face each other in an opposed manner with liquid crystal (not shown in the drawing) sandwiched therebetween. The substrate SUB2 is fixed to the substrate SUB1 by an annular sealing material SL which is formed on the peripheries of the substrates SUB1, SUB2. The sealing material SL also has a function of sealing liquid crystal in a space defined by the substrates SUB1, SUB2 and the sealing material SL. A region surrounded by the sealing material SL constitutes a liquid crystal display region AR. In the liquid crystal display region AR, as shown in FIG. 2B which shows a portion of the liquid crystal display panel PNL indicated by a dotted line circle A in an enlarged manner in the drawing, pixels PIX each of which uses liquid crystal as one constitutional component thereof are arranged in a matrix array on respective liquid-crystal-side surfaces of the substrate SUB1 and the substrate SUB2.

Further, in the liquid crystal display region AR, for example, a photosensor SNS is formed on a portion of a region of the pixel PIX on a liquid-crystal side of the substrate SUB1. The photosensors SNS are arranged at a rate of one photosensor SNS for a plurality of (for example, four in the drawings) pixels PIX which are arranged adjacent to each other. The photosensor SNS may be arranged on the portion of the region of the pixel PIX at a rate of one photosensor SNS for every pixel PIX. Due to such a constitution, the respective photosensors SNS are arranged in the liquid crystal display region AR in a uniformly dispersed manner, and function as respective sensors of the touch panel.

The backlight BL is constituted as a planar light source which uniformly radiates light to at least the liquid crystal display region AR. The backlight BL is formed of, for example, a light guide plate which faces the liquid crystal display region in an opposed manner, and a light source which is arranged on a side wall surface on one side of the light guide plate and is formed of light emitting diodes, for example.

Figure 1A:
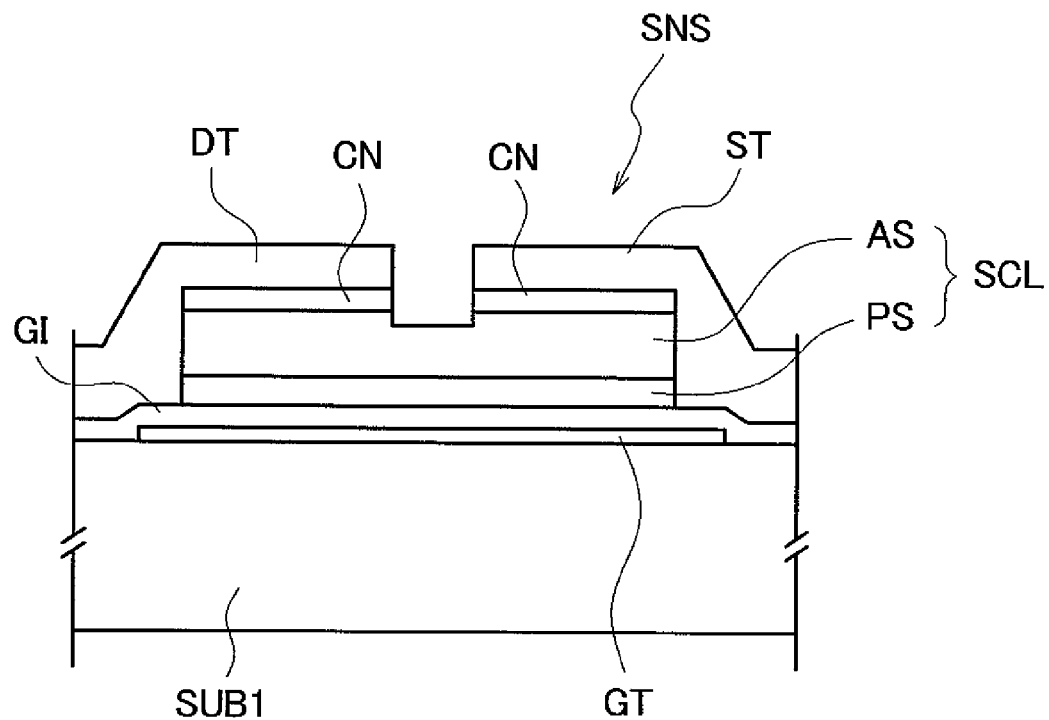
FIG. 1A and FIG. 1B are constitutional views showing a photosensor incorporated in a display device according to an embodiment 1 of the present invention.

FIG. 1A is a cross-sectional view showing the constitution of the photosensor SNS which is formed on a liquid-crystal-side surface of the substrate SUB1, for example.

In FIG. 1, a gate electrode GT is formed on a surface of the substrate SUB1. The gate electrode GT is formed of a light-blocking conductive film made of metal or the like, for example. The gate electrode GT is formed in a size which allows the gate electrode GT to project from a region where a semiconductor layer SCL described later is formed as viewed in a plan view. Due to such a constitution, the gate electrode GT has a function of blocking light emitted from the backlight BL (arranged on a lower side of the drawing). An insulation film GI is formed on the surface of the substrate SUB1 so as to cover the gate electrode GT, and the insulation film GI functions as a gate insulation film. On an upper surface of the insulation film GI, the semiconductor layer SCL which is a sequentially stacked body is formed. That is, the semiconductor layer SCL is formed by sequentially stacking a crystalline semiconductor layer PS made of polysilicon, for example, and an amorphous semiconductor layer AS made of amorphous silicon, for example. The semiconductor layer SCL is formed in an overlapping manner with the gate electrode GT, and is formed without projecting from the gate electrode GT as viewed in a plan view. A drain electrode DT and a source electrode ST are formed on a surface of the semiconductor layer SCL. The drain electrode DT and the source electrode ST are formed on the semiconductor layer SCL so as to face each other in an opposed manner as viewed in a plan view and extend to positions the outside of the region where the semiconductor layer SCL is formed along side wall surfaces of the semiconductor layer SCL. Further, on the surface of the semiconductor layer SCL, at an interface between the semiconductor layer SCL and the drain electrode DT as well as at an interface between the semiconductor layer SCL and the source electrode ST, a contact layer CN formed by implanting impurity in the amorphous semiconductor layer AS with high concentration is formed respectively. The drain electrode DT and the source electrode ST are formed such that a portion of the semiconductor layer SCL, is exposed as viewed in a plan view, and it is preferable to ensure a relatively large exposed area. This is because light which the photosensor SNS detects is radiated to the photosensor from an upper side of the drawing. Accordingly, the drain electrode DT and the source electrode ST may be formed of a transparent conductive film made of ITO (Indium Tin Oxide) or the like, for example.

In the above-mentioned constitution, an operation of the drain electrode DT and an operation of the source electrode ST are switched depending on a bias application state. In this specification, for facilitating the understanding of the explanation of the constitution of the photosensor SNS, an electrode arranged on a left side of the drawing is referred to as the drain electrode DT, and an electrode arranged on a right side of the drawing is referred to as the source electrode ST. The same goes for the explanation made hereinafter.

Figure 1B:
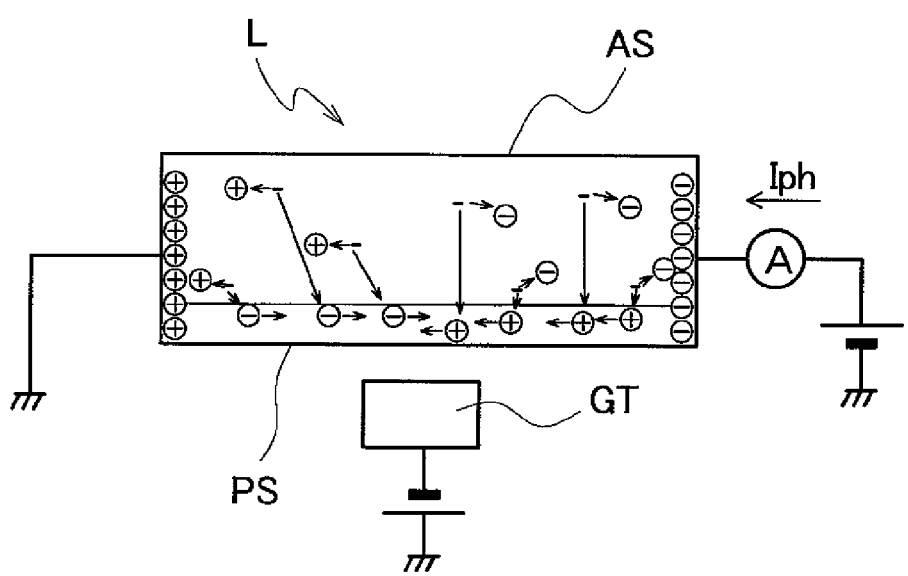

FIG. 1B is a view depicted corresponding to the photosensor SNS shown in FIG. 1A, and schematically shows the mechanism of the photoelectric conversion. In FIG. 1B, electron-hole pairs are generated in the amorphous semiconductor layer AS due to the incidence of light L on the photosensor SNS, and electrons and holes are separated from each other in the crystalline semiconductor layer PS. The electron-hole pairs are sufficiently generated in the amorphous semiconductor layer AS also due to the incidence of light having a long wavelength, and the generated electron-hole pairs are sufficiently separated from each other in the crystalline semiconductor layer PS and hence, the photoelectric conversion efficiency is enhanced.

Here, in the above-mentioned constitution, the crystalline semiconductor layer PS in which the electron-hole pairs are sufficiently separated is made of polysilicon. However, the crystalline semiconductor layer PS made of microcrystalline silicon can acquire the substantially same advantageous effect. Accordingly, the crystalline semiconductor layer PS may be formed using microcrystalline silicon in place of polysilicon.

Figure 3:
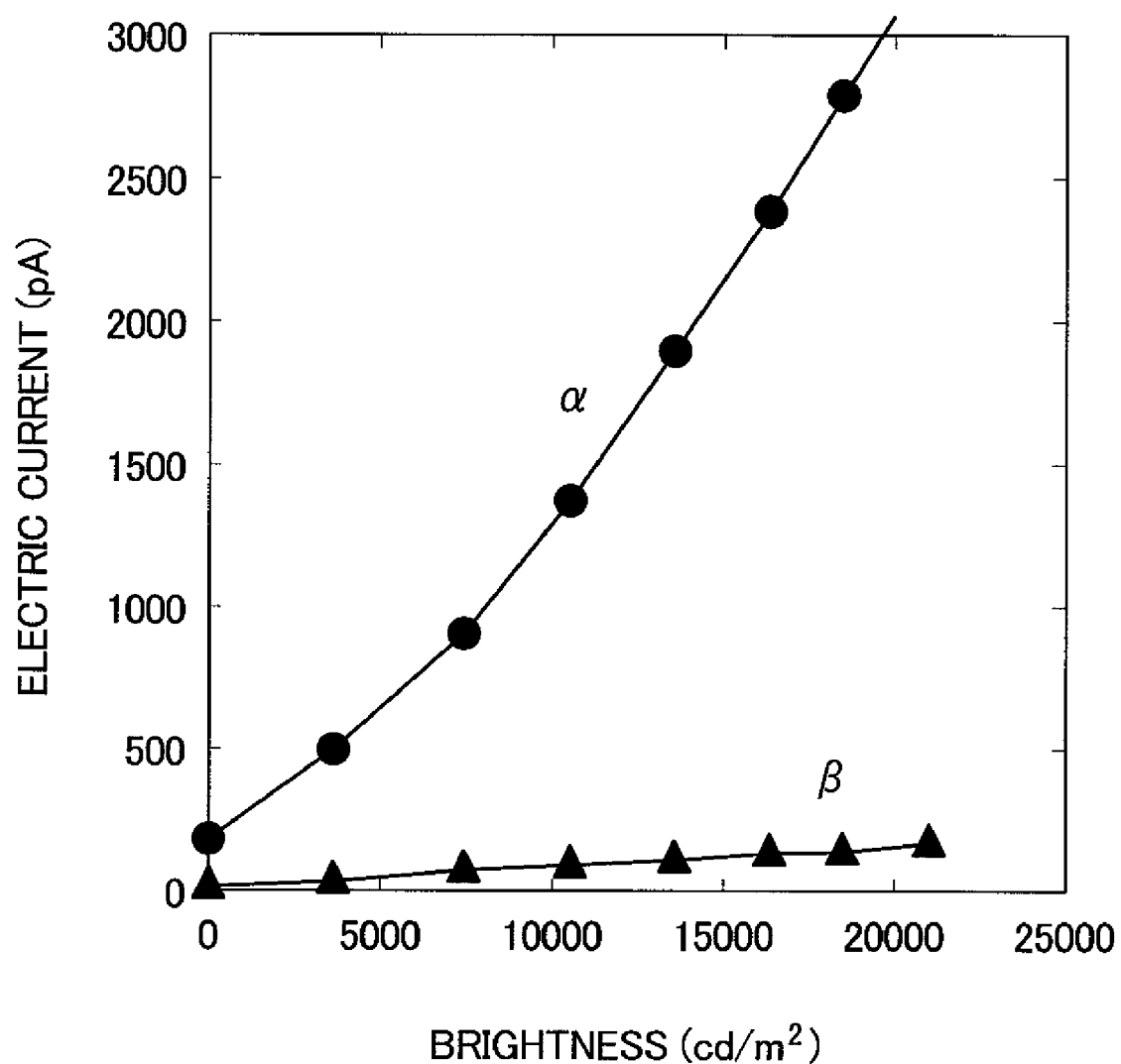
FIG. 3 is a graph showing a characteristic indicative of photoelectric conversion efficiency of the photosensor incorporated in the display device of the present invention in comparison with a characteristic indicative of photoelectric conversion efficiency of a conventional photosensor.

FIG. 3 is a graph showing a photoelectric conversion characteristic α of the photosensor SNS shown in FIG. 1. In the graph, the brightness of light ($cd/m^2$) which is incident on the photosensor SNS is taken on an axis of abscissas, and an electric current (pA) which is generated in the photosensor SNS is taken on an axis of ordinates. For comparison, a photoelectric conversion characteristic β of a photosensor whose semiconductor layer is made of only amorphous silicon is also shown in the graph. To compare the photoelectric conversion characteristic α with the photoelectric conversion characteristic β of the photosensor made of amorphous silicon, it is understood that the photoelectric conversion characteristic α of the photosensor according to this embodiment is largely enhanced.

Figure 4:
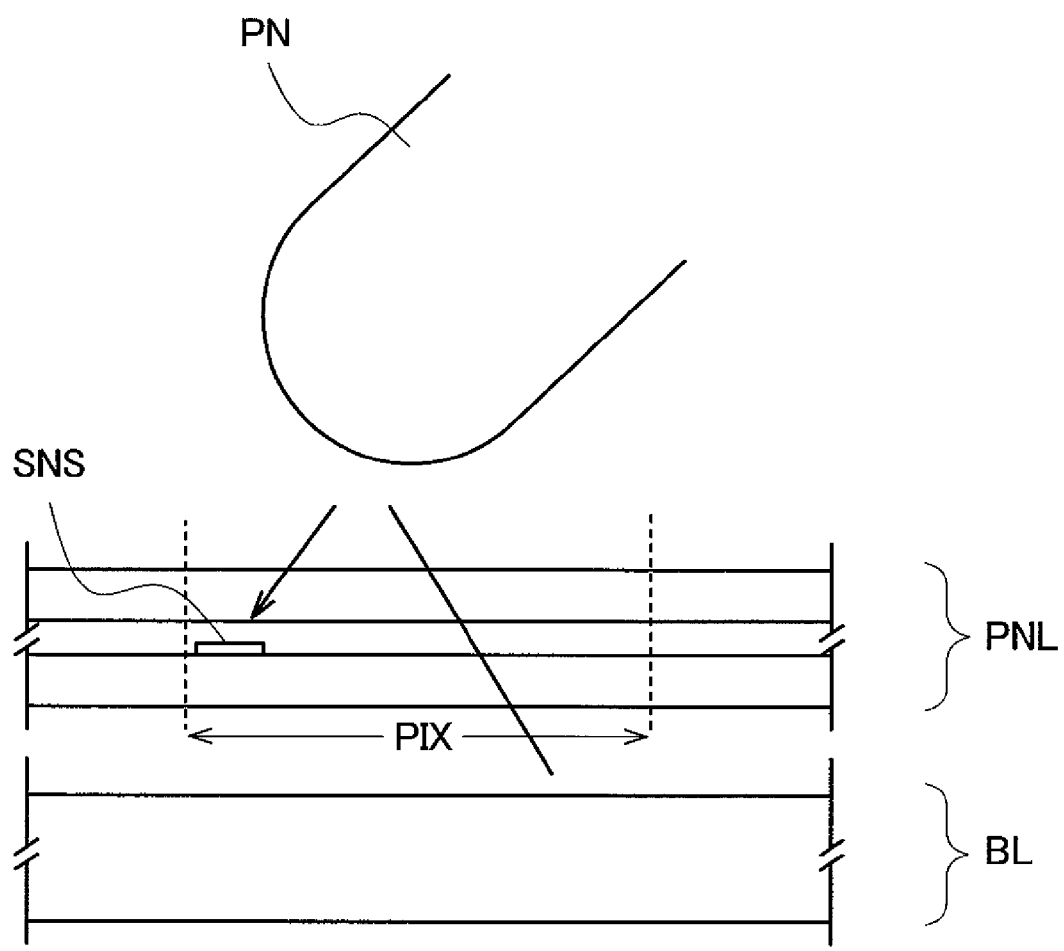
FIG. 4 is an explanatory view for explaining a reason that the photosensor of the display device of the present invention is used as a substitute for a touch panel.

FIG. 4 shows one example of a method where the photosensor SNS detects a pen PN when the pen PN approaches a panel surface of the liquid crystal display panel PNL of the liquid crystal display device shown in FIG. 2. In FIG. 4, when the pen PN approaches the panel surface of the liquid crystal display panel PNL, light emitted from the backlight BL is reflected on the pen PN and is incident on the photosensor SNS. Accordingly, the photosensor SNS can detect coordinates of the pen PN although the pen PN is not in contact with the liquid crystal display panel PNL.

Figure 5A:
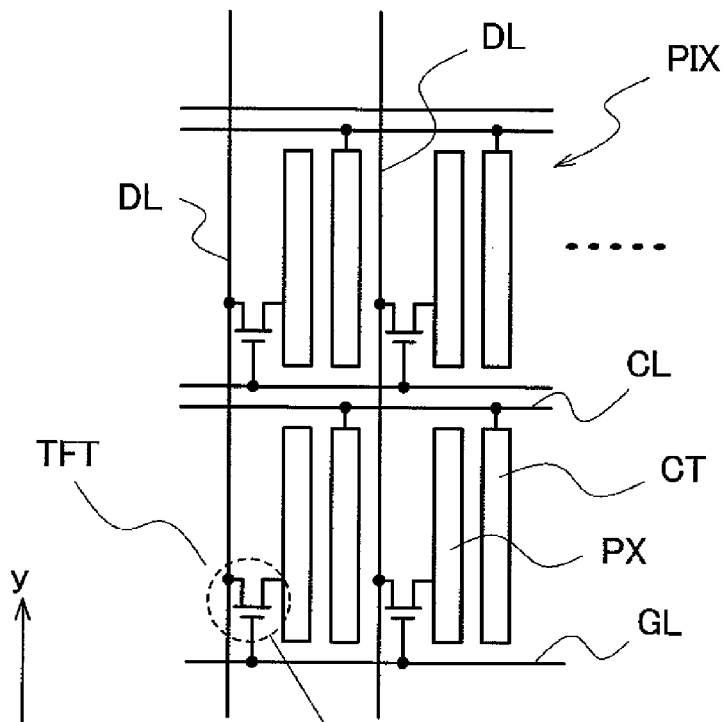
FIG. 5A is a constitutional view of a pixel of the display device of the present invention and FIG. 5B is a cross-sectional view of a thin film transistor which is formed in the pixel.

In the photosensor having the above-mentioned constitution, the semiconductor layer is formed of the stacked body consisting of the crystalline semiconductor layer PS and the amorphous semiconductor layer AS and hence, the photosensor does not require the particularly complicated constitution. Accordingly, the present invention can acquire an advantageous effect that the photosensor can be formed simultaneously with the formation of the thin film transistor TFT within the pixel PIX. FIG. 5A is an equivalent circuit diagram showing the pixels PIX in the liquid crystal display region AR, and shows a state where 4 pixels PIX which are arranged adjacent to each other are extracted from the liquid crystal display region AR and are shown. In FIG. 5A, gate signal lines GL which extend in the x direction and are arranged parallel to each other in the y direction in the drawing and drain signal lines DL which extend in the y direction and are arranged parallel to each other in the x direction in the drawing are shown. A region which is surrounded by a pair of neighboring gate signal lines GL and a pair of neighboring drain signal lines DL constitute a pixel region. In each pixel region, a thin film transistor TFT which is turned on in response to a scanning signal from the gate signal line GL, a pixel electrode PX to which a video signal is supplied from the drain signal line DL via the thin film transistor TFT in an ON state, and a counter electrode CT which generates an electric field between the pixel electrode PX and the counter electrode CT are provided thus constituting the pixel PIX. Here, the counter electrode CT is connected to a common signal line CL which is arranged parallel to the gate signal line GL, for example, and a reference signal which becomes a reference with respect to the video signal is supplied to the counter electrode CT via the common signal line CL.

Figure 5B:
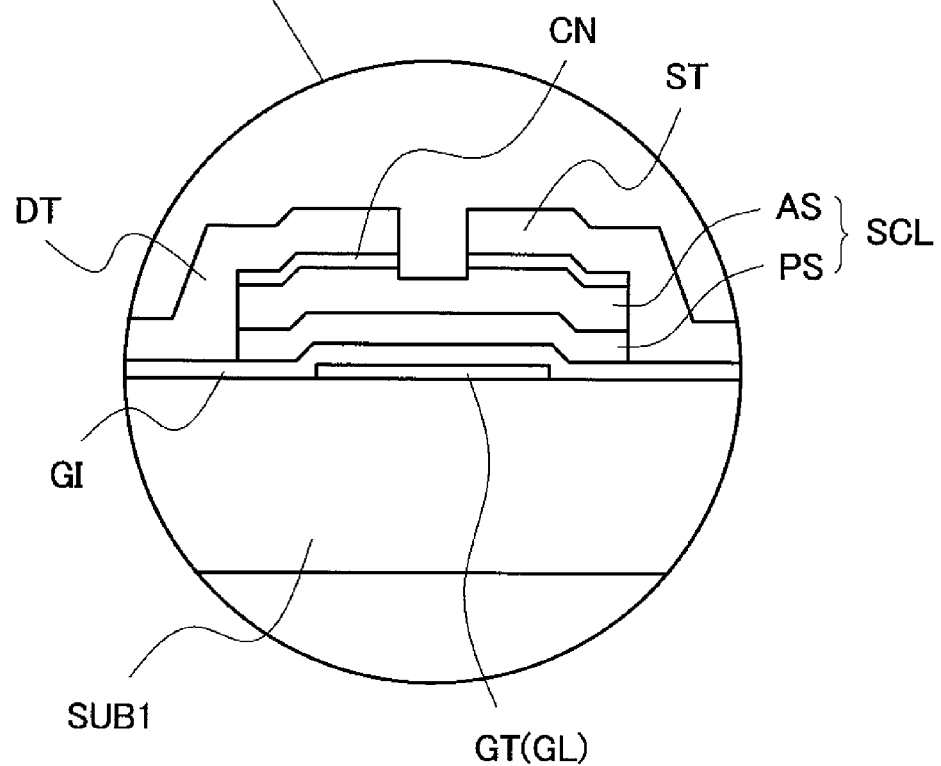

Further, FIG. 5B is a cross-sectional view of the thin film transistor TFT which is formed on a liquid-crystal-side surface of the substrate SUB1. The thin film transistor TFT is a transistor having the so-called bottom-gate-type MIS (Metal Insulator Semiconductor) structure. A semiconductor layer SCL of the thin film transistor TFT is also formed of a sequentially stacked body consisting of a crystalline semiconductor layer PS and an amorphous semiconductor layer AS. That is, the semiconductor SCL has the substantially same constitution as the constitution shown in FIG. 1A. (However, the photosensor SNS shown in FIG. 1A is constituted as a diode and hence, the gate electrode and one electrode out of the drain electrode and the source electrode are connected with each other). Accordingly, the photosensors can be formed simultaneously with the formation of the thin film transistors TFT.

Here, in the above-mentioned thin film transistor TFT, the semiconductor layer SCL is formed of the sequentially stacked body consisting of the crystalline semiconductor layer PS and the amorphous semiconductor layer AS. The thin film transistor having such a constitution can decrease a so-called S value (swing factor) and, at the same time, can suppress the fluctuation of a threshold voltage. However, the semiconductor layer SCL is not limited to such a constitution and may be formed of only the crystalline semiconductor layer PS, or may be formed of only the amorphous semiconductor layer AS. Even when the thin film transistor TFT adopts such constitutions, the photosensors can be formed simultaneously with the formation of the thin film transistors TFT.

Embodiment 2

FIG. 6 is a view showing a display device according to an embodiment 2 of the present invention, and is a cross-sectional view showing a photosensor SNS which is incorporated in the display device. FIG. 6 corresponds to FIG. 1A.

The constitution which makes the photosensor SNS of this embodiment 2 shown in FIG. 6 differ from the photosensor shown in FIG. 1A lies in the constitution of the drain electrode DT and the source electrode ST. That is, the drain electrode DT and the source electrode ST are respectively connected to a crystalline semiconductor layer PS via contact holes TH formed in a contact layer CN and an amorphous semiconductor layer AS. Although the contact layer CN is formed in FIG. 6, the contact layer CN may not be formed. This is because the photosensor SNS which does not have such a contact layer CN can also be operated as a photosensor.

Embodiment 3

FIG. 7 is a view showing a display device according to an embodiment 3 of the present invention, and is a cross-sectional view showing a photosensor SNS which is incorporated in the display device. FIG. 7 corresponds to FIG. 1A.

The constitution which makes the photosensor SNS of this embodiment 3 shown in FIG. 7 differ from the constitution shown in FIG. 1A lies in that, firstly, the photosensor SNS of this embodiment is used as a photosensor for detecting a quantity of light emitted from a backlight BL. Due to such a constitution, the display device can control a quantity of light emitted from the backlight BL to a proper quantity corresponding to a light detection value of the photosensor SNS.

Further, the photosensor SNS of this embodiment is configured such that light from the backlight BL is radiated to the photosensor SNS after passing through the substrate SUB1, and a gate electrode GT of the photosensor SNS is formed within a portion of a region where a semiconductor layer SCL of the photosensor SNS is formed as viewed in a plan view. Accordingly, the radiation of light is not completely blocked by the gate electrode GT.

Embodiment 4

Figure 8:
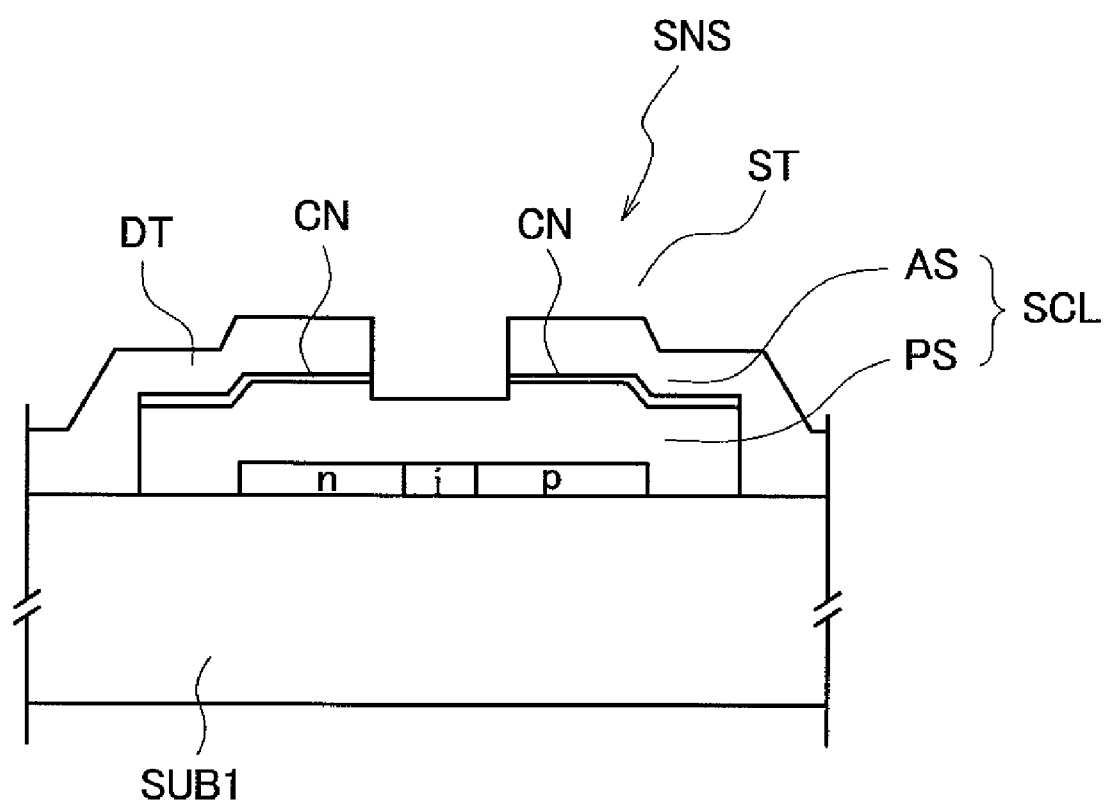
FIG. 8 is a constitutional view showing a photosensor which is incorporated in a display device according to an embodiment 4 of the present invention.
Figure 9A:
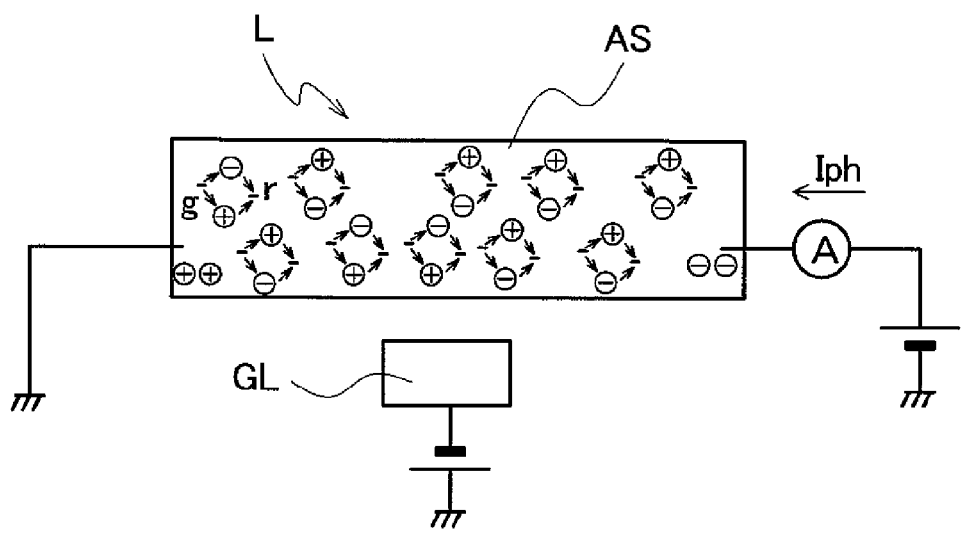
FIG. 9A and FIG. 9B are views showing a mechanism of the photoelectric conversion of a photosensor which is incorporated in a conventional display device.
Figure 9B:
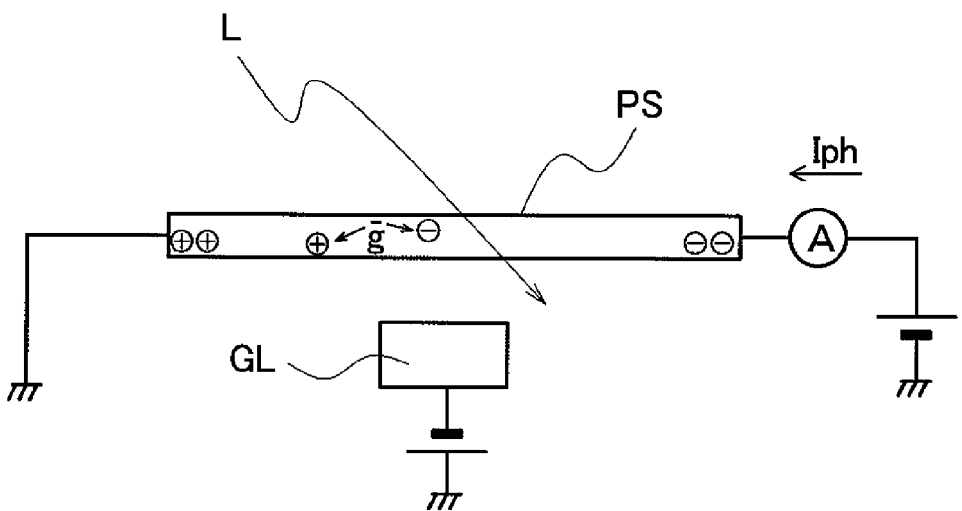

FIG. 8 is a view showing a display device according to an embodiment 4 of the present invention, and is a cross-sectional view showing a photosensor SNS which is incorporated in the display device. FIG. 8 is a view corresponding to FIG. 1A.

The constitution which makes the photosensor SNS of this embodiment 4 shown in FIG. 8 differ from the constitution shown in FIG. 1A lies in that the photosensor SNS is not provided with a gate electrode GT. That is, a semiconductor layer SCL is formed of a sequentially stacked body formed by stacking a crystalline semiconductor layer PS and an amorphous semiconductor layer AS from a substrate SUB1 side, and the crystalline semiconductor layer PS is formed of respective layers consisting of an n-type layer PSN, an i layer PSI and a p-type layer PSP arranged from a left side to a right side in the drawing, for example, thus constituting a diode.

Further, on a surface of the semiconductor layer SCL, the drain electrode DT and the source electrode ST are formed. The drain electrode DT and the source electrode ST are formed on a surface of the semiconductor layer SCL. The drain electrode DT and the source electrode ST are formed on the semiconductor layer SCL so as to face each other in an opposed manner and extend toward the outside of the region where the semiconductor layer SCL is formed along a side wall surface of the semiconductor layer SCL. Further, on the surface of the semiconductor layer SCL, at an interface between the semiconductor layer SCL and the drain electrode DT as well as at an interface between the semiconductor layer SCL and the source electrode ST, a contact layer CN formed by implanting impurity in the amorphous semiconductor layer AS with high concentration is formed respectively.

Also by constituting the photosensor as described above, in the same manner as the embodiment 1, electron-hole pairs are generated in the amorphous semiconductor layer AS due to the incidence of light on the photosensor SNS, and electrons and holes are separated from each other in the crystalline semiconductor layer PS. The electron-hole pairs are sufficiently generated in the amorphous semiconductor layer AS also due to the incidence of light having a long wavelength, and the generated electron-hole pair is sufficiently separated from each other in the crystalline semiconductor layer PS and hence, the photoelectric conversion efficiency is enhanced.

The connection state of the electrodes explained in the embodiment 2 (FIG. 6) is applicable to the constitution shown in FIG. 8.

Embodiment 5

In the embodiments 1 to 3, the photosensor having the substantially same constitution as the thin film transistor TFT is the so-called bottom-gate-type transistor which is formed by stacking the gate electrode, the gate insulation film and the semiconductor layer in this order from the substrate SUB1 side. However, the photosensor is not limited to the above-mentioned bottom-gate-type transistor and may be a so-called top-gate-type transistor which is formed by stacking the semiconductor layer, the gate insulation film and the gate electrode in this order from the substrate SUB1 side. Also in the top-gate-type transistor, by forming the semiconductor layer using a stacked body consisting of a crystalline semiconductor layer and an amorphous semiconductor layer and arranging the crystalline semiconductor layer on a gate-insulation-film side, it is possible to obtain the substantially same advantageous effect as the photosensor SNS explained in conjunction with the embodiment 1.

Embodiment 6

In the above-mentioned embodiments, the explanation has been made by taking the liquid crystal display device as an example. However, the present invention is not limited to the liquid crystal display device, and is applicable to other display devices such as an organic EL display device, for example.

Although the present invention has been explained in conjunction with embodiments heretofore, the constitutions explained in the above-mentioned respective embodiments merely show one example of the present invention, and various modifications of the present invention are conceivable without departing from the technical concept of the present invention. Further, the constitutions explained in the respective embodiments may be adopted in combination unless these constitutions become contradictory.

What is claimed is:

1. A display device which forms photosensors on a substrate thereof, wherein
the photosensor is formed by sequentially stacking a gate electrode, a gate insulation film and a semiconductor layer in such an order or in an opposite order from a substrate side, and electrodes are connected to both sides of the semiconductor layer respectively,
the semiconductor layer is formed of a stacked body consisting of a crystalline semiconductor layer and an amorphous semiconductor layer, and
the crystalline semiconductor layer is arranged on a gate insulation film side.

2. A display device according to claim 1, wherein the crystalline semiconductor layer is made of polysilicon or microcrystalline silicon, and the amorphous semiconductor layer is made of amorphous silicon.

3. A display device according to claim 1, wherein the photosensor is formed by sequentially stacking the gate electrode, the gate insulation film, and the semiconductor layer in such an order from the substrate side,
an impurity semiconductor layer doped with impurities is formed on a surface of the amorphous semiconductor layer, and
the respective electrodes are connected to the semiconductor layer via the impurity semiconductor layer.

4. A display device according to claim 1, wherein the photosensor is formed by sequentially stacking the gate electrode, the gate insulation film and the semiconductor layer in such an order from the substrate side, and
the respective electrodes are connected to the crystalline semiconductor layer via contact holes which are formed in the amorphous semiconductor layer.

5. A display device according to claim 1, wherein the display device includes a display region in which pixels are arranged in a matrix array, and the photosensor is formed in a portion of a region of the pixel.

6. A display device according to claim 5, wherein a plurality of photosensors are formed, and
the plurality of photosensors are arranged within the display region in a dispersed manner.

7. A display device according to claim 1, wherein the display device is a liquid crystal display device.

8. A display device according to claim 7, wherein the display device is formed of a liquid crystal display panel and a backlight which is arranged on one surface side of the liquid crystal display panel, and the photosensors detect a quantity of light emitted from the backlight.

9. A display device according to claim 1, wherein the display device is an organic EL display device.

* * * * *